United States Patent [19]

Blackmer

[11] 4,112,254
[45] Sep. 5, 1978

[54] SIGNAL COMPANDER SYSTEM
[75] Inventor: David E. Blackmer, Wilton, N.H.
[73] Assignee: DBX, Inc., Newton, Mass.
[21] Appl. No.: 842,465
[22] Filed: Oct. 17, 1977
[51] Int. Cl.² ............................................. H04B 3/04
[52] U.S. Cl. ........................... 179/1 VL; 179/15.55 R
[58] Field of Search ...... 179/1 VL, 15.55 R, 15.55 T; 333/14

[56]  References Cited
  U.S. PATENT DOCUMENTS

| 2,510,879 | 6/1950 | Freccia | 179/1 VL |
| 3,789,143 | 1/1974 | Blackmer | 179/1 VL |

Primary Examiner—Kathleen H. Claffy
Assistant Examiner—E. S. Kemeny
Attorney, Agent, or Firm—Schiller & Pandiscio

[57] ABSTRACT

An improved signal conditioning compander system includes one or more weighting networks designed so that the system provides a substantially flat single-frequency sine wave sweep response through or on the transmission medium throughout the frequency bandwidth of interest.

The system provides greater high-frequency weighting than heretofore practical and at the same time permits full level transmission over the entire frequency spectrum transmitted or recorded.

21 Claims, 8 Drawing Figures

SIGNAL COMPANDER SYSTEM

This application relates to signal conditioning systems and more particularly to an improved system for signal compression and expansion.

In many audio signal transmission media such as phonograph records, recording tapes, motion picture sound recordings and broadcasting, the signal-to-noise ratio is sufficiently limited to interfere with the enjoyment or comprehension of the signal by the listener.

One limiting factor of the signal-to-noise ratio arises from the inherent nature of these transmission media to saturate beyond a particular range of amplitudes of signals transmitted through each of the media. More specifically, each transmission medium has an "inherent dynamic range" which limits the dynamic range of signals which can be transmitted through or recorded in the medium without saturation occurring. In FM broadcast, this inherent dynamic range manifests itself in what is commonly referred to as the "modulation index," i.e. a characteristic of the transmission medium described in terms of the amount of frequency deviation which occurs in relationship to the modulating frequency, or stated in another way, the maximum phase shift of the carrier signal (see, for example, Schwartz, Mischa; *Information Transmission, Modulation and Noise*; McGraw-Hill Book Co., Ing.; New York; 1959; page 115). The larger the modulation index of a transmission medium is, the greater are the required transmission power, the size of a receiving antenna and/or the size of the transmission bandwidth.

Whether the transmission path is in the nature of a recording, such as magnetic tapes, or in the nature of a transmission channel, such as an FM transmission channel, the effect of the inherent dynamic range or the modulation index, of the medium is to limit the signal-to-noise ratio when the program or information signal is transmitted through or recorded in the medium.

Various signal conditioning systems and techniques have therefore been developed for improving the signal-to-noise ratio of transmitted or recorded program signals through such transmission media. One technique which has proven worthwhile, as well as commercially successful, is generally known as the DBX encoding and deccoding process (also referred to as the DBX companding process). This process as well as apparatus (referred to as a compander) for carrying out the process is described in U.S. Pat. No. 3,789,143, issued to David E. Blackmer on Jan. 29, 1974. The DBX compander of the type described in the patent generally dynamically compresses (encodes) the signal prior to transmission or recording and dynamically expands (decodes) signal in a complementary manner, after transmission or upon playback.

The advantages of the DBX compander is that it compresses and subsequently expands the signal over its full dynamic range, i.e. over the entire frequency bandwidth of interest. By companding over the full dynamic range, the program signal actually becomes more listenable than uncompanded program material to the casual listener in a moderate signal-to-noise environment. This appears to occur because the subsequently expanded lower intensity sounds mask the noise thereby creating the illusion of greater dynamic range. Further, continuous constant slope compression has a more pleasing effect than the same over-all dynamic compression obtained by gain riding or peak limiting. Thus, by way of example, in a 2:1 compression and subsequent 2:1 expansion system, a transmission channel theoretically having a 46dB inherent dynamic range can be expanded to provide a 92dB effective dynamic range throughout the bandwidth of interest. In practice, using the DBX companding technique to transmit a signal through a particular medium or channel, it is often desirable to provide complementary high frequency emphasis and weighting in both the compressor and expander. More specifically, it is desirable to boost the high frequency portions of the transmitted or recorded signal during encoding or compressing the signal and to provide an equal deemphasis in the expander to overcome or reduce the effects of high frequency noise modulation by the signal envelope when transmitted over the transmission path. The compander of the type described in U.S. Pat. No. 3,789,143 also utilizes high frequency weighting in the level sensor (or feedback paths of both the compressor and expander) to control this high frequency boost in the signal path.

With this high frequency preemphasis and weighting, the effective dynamic range through the transmission path actually varies over the frequency range of interest. More specifically, the single frequency response curve of the output of the compressor of companders of the type described is not flat but exhibits high frequency roll-off due to the high frequency pre-emphasis weighting, particularly in the frequency range between about 2.210 KHz and 30 KHz. Thus, when the output of the compressor is transmitted through the transmission medium, at a particular signal level input, the signal may saturate at one frequency before it saturates at others. For example, present FM telecommunication systems, such as those using satellites as a part of the communication linkage, include high frequency restrictions due to high frequency preemphasis which in turn sets the modulation limit. This is of particular concern for example, since certain line response tests are characteristically signals which have at least a constant high frequency component, while touch tone signals can contain high frequency information which may include two or more touch tone signals simultaneously transmitted and providing undesirable cross-modulation. The practical effect is, that in order to avoid distortions arising from medium saturation, the actual increase in dynamic range at the frequency where the signal first begins to saturate. Thus, when transmitting or recording a signal encoded by the DBX compressor of the aforementioned patent, the greater boost and pre-emphasis of the high frequency portions of the program signal brings about channel saturation at the higher frequencies before saturation is achieved at the lower frequencies. The high frequency content of the program material thus often sets the dynamic limit of the input program level. This high frequency saturation problem is illustrated when sibilant speech produces "over modulation" in FM transmission media and "splattering" in motion picture sound recording.

It is an object of the present invention, therefore, to provide a special class of linear decibel compression and expansion companders which exhibit a substantially flat single-frequency sine wave sweep response through a transmission medium within the frequency bandwidth of interest.

It is another object of the present invention to provide an improved signal-conditioning system in which the signal-to-nosie ratio with respect to encoded signals transmitted or recorded through a transmission medium is improved.

And another object of the present invention is to provide a signal conditioning system providing greater high frequency weighting than heretofore practical and at the same time permitting full level transmission over the entire frequency spectrum transmitted or recorded.

Yet another object of the present invention is to provide a signal-conditioning companding system in which a greater amount of pre-emphasis may be added to the entire dynamic range of the transmission channel or medium.

Still another object of the present invention is to provide an improvement in the companding system of the type described in U.S. Pat. No. 3,789,143.

These and other objects of the present invention are achieved by a signal-conditioning system including one or more weighting networks designed so that the system provides a substantially flat single-frequency sine wave sweep response through or on the transmission medium throughout the frequency bandwidth of interest.

Other objects of the present invention will, in part, be obvious and will, in part, appear hereinafter. The invention accordingly comprises the apparatus possessing the construction, combination of elements, and arrangement of parts which are identified in the following detailed disclosure, and the scope of the application of which will be indicated in the claims.

For a fuller understanding of the nature and objects of the present invention, reference should be had to the following detailed description taken in connection with the accompanying drawings, wherein:

FIG. 1 is a block diagram of a compander of the type described in U.S. Pat. No. 3,789,143;

Figure 1:
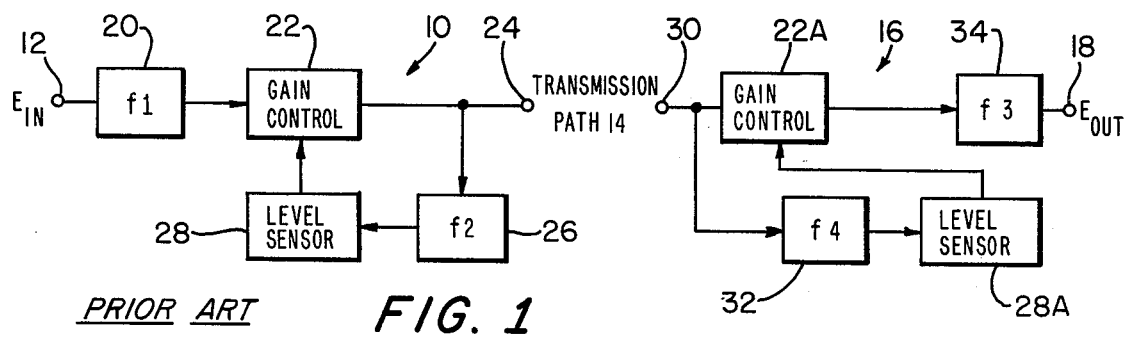

Referring to FIG. 1, the compander of the type described in U.S. Pat. No. 3,789,143 generally includes a compressor 10 for encoding or compressing the input signal, Ein, applied to the input terminal 12, prior to recording or transmitting the signal on or through the transmission path or channel 14. Subsequent to transmission or recording of the encoded signal, the latter is decoded by the expander 16, whereupon the decoded signal, Eout, is provided at the output terminal 18.

More specifically, the input signal appearing at the input terminal 12 of the compressor 10 is applied through high frequency weighting filter 20 to the input of a gain control module 22. The output of module 22 provides the output of the compressor at terminal 24 and is also applied through a negative feedback or level sensing path comprising a second high frequency weighting filter 26 connected to the input of a level sensor 28. This level sensing path is designed to apply a control signal to the module 22 in response to the signal level of the output of the module. Level sensor 28 includes detection means, preferably in the form of an RMS detector (not shown) for sensing the instantaneous signal level from the output of the module 22 as modified by filter 26, on a low-ripple or ripple-free RMS basis so that the output of the detection means is linearly related to its input in decibels. Level sensor 28 also includes a control amplifier (not shown) for setting the gain change sense, in this case compression, and for providing the control signal output to the module 22. The control signal is related to the product of the output of the detection means and a gain factor introduced by the control amplifier. The module 22 amplifies or controls the gain of the weighted input signal Ein in proportion to the weighted control signal provided by level sensor 28. By way of example, where the gain factor of the control amplifier of the level sensor is set to provide 3:1 compression, theoretically a change in 30 dB of the input signal, Ein, (at all frequencies within the bandwidth of interest) produces a corresponding 20 dB change in the control signal applied by the level sensor 28 to module 22 to produce a 10 dB change in the output signal of the module at terminal 24. Thus, theoretically, a transmission medium having an inherent dynamic range of 46 dB can carry a signal compressed by a 3:1 compressor having a dynamic range of 138 dB.

The signal, once transmitted through or recorded on the transmission medium 14, is applied to the input terminal 30 of expander 16 so that the signal can be subsequently decoded. The expander is essentially the complement of compressor 10 and thus includes the gain control module 22A and level sensor 28A, both of which are identical to the module 20 and level sensor 24, respectively, except they are modified and connected so as to expand the encoded signal back to its original condition. Thus, the input terminal 30 is connected to both the inputs of the gain control module 22A and to a positive feedforward path comprising weighting filter 32 and level sensor 28A, with the output of the latter providing the control signal to the gain control module 22A. The sensor 28A includes the same detection means (not shown), preferably in the form of an RMS detector, for sensing a signal level of the input of the weighted encoded signal on a low-ripple or ripple-free RMS basis so that the output of the detection means is linearly related to its input in decibels. The control amplifier (not shown) of the level sensor is set for the same gain as provided by its counterpart in the compressor, but in the opposite sense, i.e. for expansion. The output of module 22A is applied through complementary weighting filter 34 to the output terminal 18. The expander 16 therefore restores the encoded signal back to its original level. In the example of a 3:1 compander where a 3:1 compressor is used, the gain of the control amplifier of level sensor 28A is set to provied 3:1 expansion. Thus, where an input signal at terminal 30, previously encoded by a 3:1 compressor changes by 10 dB, the control signal output of level sensor 28A will provide a 20 dB change. Since the gain change sense is one of the expansion, the change in the output at terminal 18 will provide a 30 dB change.

The weighting filters 20, 26, 32 and 34 are typically designed to boost the high frequency portions, e.g. 2120

Hz to 15 KHz for FM transmission, of the transmitted or recorded signal during encoding and provide an equal de-emphasis in the expander to overcome or reduce the effects of high frequency noise modulation by the signal envelope and thus improve the signal-to-noise ratio. Ordinary forms of pre-emphasis provided by filters 20 and 26 however, have been found to create high frequency overload problems at least in typical tape recording and FM transmission media. This overload problem arises, at least in part, from the fact that the single-frequency sine-wave sweep response curve over the frequency band width of interest of a signal transmitted or recorded in the medium is not flat.

Figure 2:
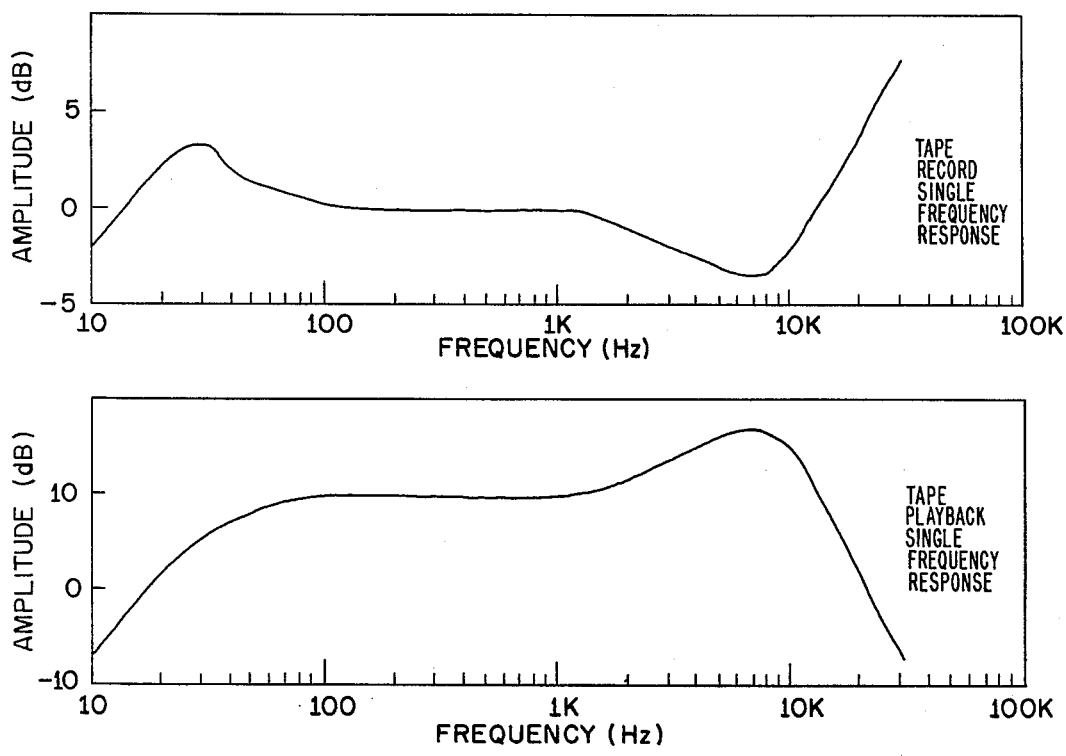
FIG. 2 shows a single-frequency response curves provided by both a 2:1 compressor and the 2:1 expander of a compander of the type shown in FIG. 1.

For example, referring to FIG. 2 a single-frequency sine-wave sweep response curve is shown for an encoded or compressed signal provided by a 2:1 compressor of the type described with respect to FIG. 1, for subseqeuent recordation on magnetic tape. It is noted that since high frequency preemphasis is provided in the signal path by filter 20 as well as high frequency weighting in the level sensing path by filter 26, there is a significant effect on those high frequency portions of the signal between about 2 KHz and about 30 KHz. A single frequency sine wave sweep response curve of an expander is also shown in FIG. 2. In this case, a signal-frequency sine wave sweep input between about 10 Hz and 30 KHz was applied to the input terminal 30 of a 2:1 expander, of the type described with respect to FIG. 1, so as to produce the curve shown in FIG. 2. As will be evident from the curves, the curve indicating the single frequency response of the expander is essentially the complement of the single-frequency response curve of the compressor, at least between about 30 Hz and 30 KHz, the bandwidth which is typically of interest in audio transmission and recording.

As shown by the curves in FIG. 2, a signal encoded by a 2:1 compressor having the single frequency response curve shown, is not flat and thus the amount of increased dynamic range actually varies over the frequency bandwidth of interest. In accordance with the present invention, means for providing a pre-emphasis and complementary de-emphasis in the compressor and the expander, respectively, of a signal-conditioning system are provided so as to substantially flatten the single-frequency sine wave sweep response of the encoder so that full level transmission can be achieved through the transmission medium over the entire frequency bandwidth of interest, while at the same time providing for greater high frequency weighting than heretofore thought practical. The means preferably includes one or more weighting networks of a special class placed in the signal and level sensing paths.

Figure 3:
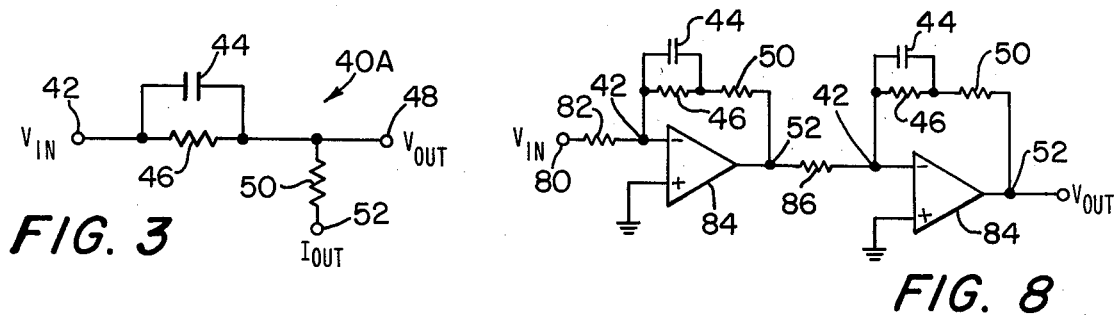
FIG. 3 shows a circuit schematic of a preferred embodiment of a network of the class employed in the present invention.
Figure 5:
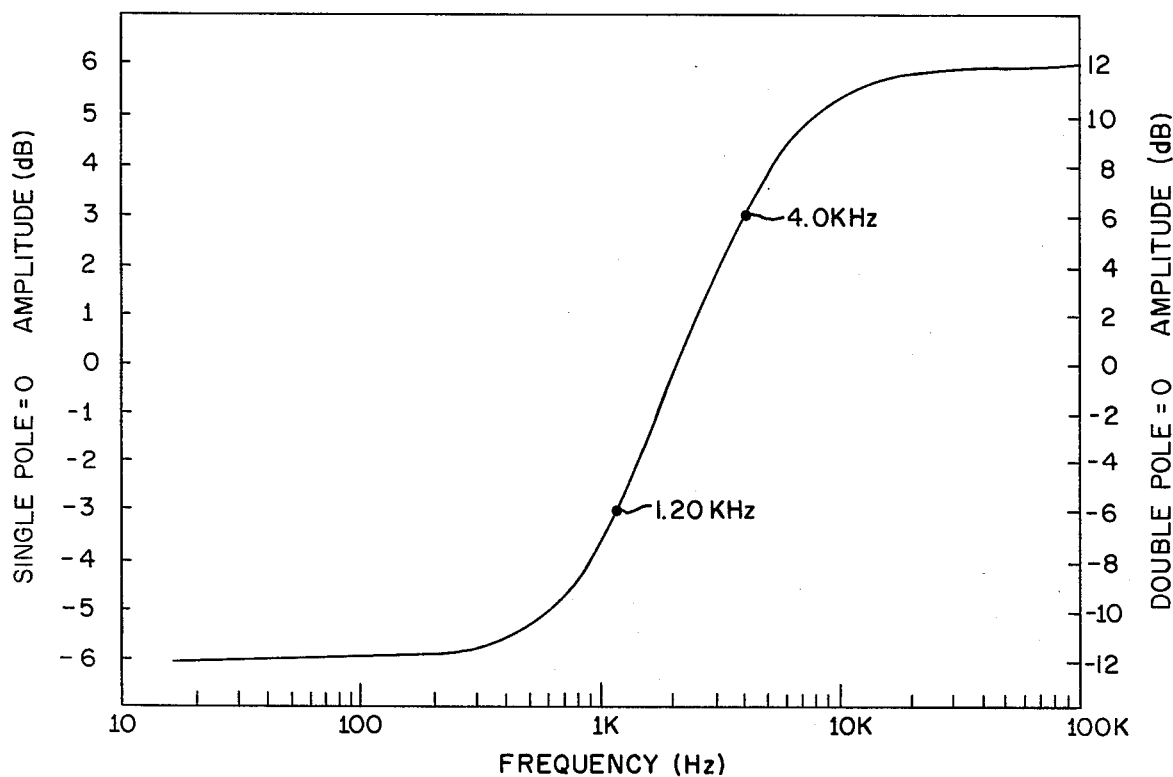
FIG. 5 shows the graphical illustration of the network amplitude-frequency response curve of the networks shown in FIGS. 3 and 4.

More specifically, referring to FIG. 3 the preferred network 40 is a single pole-zero network which has its pole and zero placed at preselected frequencies to provide the desired high frequency weighting. The preferred network 40A, designed to operate in either a current or a voltage mode, includes an input terminal 42 connected to one plate of capacitor 44 and to resistor 46, the latter in turn being connected with the other plate of the capacitor 44 to the output terminal 48 and through resistor 50 to ground or a virtual ground current summing junction indicated generally at 52. As well known in the art, at zero frequency, the capacitor 44 is an open circuit so that resistors 46 and 50 act as a voltage divider, i.e. (Vout/Vin) equals [R50/(R50 + R46)]. As the frequency of Vin increases, more and more of the signal is transmitted through the capacitor and less through resistor 46, until at relatively high frequencies, the capacitor 44 acts essentially as a short circuit around resistor 46 and Vout approximately equals Vin. As illustrated in FIG. 5, each weighting network is preferably designed for FM transmission to have a zero at 1.2 KHz and a pole at 4 KHz, and time constants of 133$\mu$ sec and 40$\mu$ sec at the two frequencies, respectively. These particular time constants are achieved when the values of capacitor 44 and resistors 46 and 50 are 10 nF, 13.3 Kohms and 5.72 Kohms, respectively. As will be evident hereinafter, in companders other than the 2:1 compander, in order to provide the necessary high frequency pre-emphasis and weighting it is necessary to connect two or more of the networks 40 in series with one another.

Figure 4:
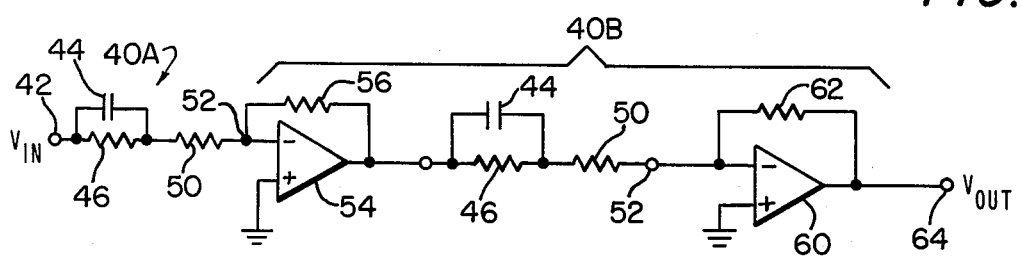
FIG. 4 shows a circuit schematic of a preferred embodiment of two cascaded networks, each of the class utilized in the present invention.

Referring to FIG. 4, two such networks are shown connected together in series to provide a two pole-zero network. In such a situation, the current mode output 52 of the preferred single pole-zero network 40A of FIG. 3 is preferably connected to the single pole-zero network 40B designed to operate in a current mode. More specifically, the output 52 of network 40A is connected to the negative input of the voltage-follower and buffer 54 and through feedback resistor 56 to the output of the follower, the positive input of follower 54 is connected to system ground. The output of follower 54 is connected to the input 46 of a second network 40A connected to operate in a current mode. Thus, the current mode output terminal 52 is connected to the negative input of another current-voltage follower and buffer 54 having a nominal resistance 56 in its feedback loop. Follower 54 converts the current at its negative input to a voltage output at terminal 58. The double pole-zero network of FIG. 4 is designed to have superimposed poles and zeros, all of which have the same time constants as the single pole-zero network 40A described in FIG. 3.

As shown in FIG. 5 the amplitude-frequency curves of the single pole-zero network 40A and double pole-zero network formed by connecting networks 40A and 40B are identical, except that the total weighting of the single pole-zero network 40A is 12 dB while the amount of weighting provided by the double pole-zero network formed by networks 40A and 40B (simply the sum of two single pole-zero networks) is 24 dB.

Although single and double pole-zero networks have been described, it will be obvious that in companders where three weighting networks are needed in either the signal or level sensing paths, the output terminal 58 of the double pole-zero network of FIG. 4 is merely connected to the input terminal 42 of the single pole-zero network 40A of FIG. 3 which in turn has its current mode output terminal connected to the negative input of a current-voltage follower 54 having feedback resistor 56, and its positive input connected to ground to provide a three pole-zero network having superimposed poles and zeros. In such a case, in the preferred system for F.M. transmission the amplitude-frequency curve of the three pole-zero network will be identical to that shown in FIG. 5 except that the amount of pre-emphasis increases to 36 dB. For a four pole-zero network two of the two pole-zero networks of FIG. 4 are merely connected together, in seriatim, providing a pre-emphasis or weighting of 48 dB for FM transmission, with an addition network 40A and follower 54 being added for each additional pole and zero desired. The number of weighting filters which can be connected together, therefore, is not limited but is merely a function of the amount of weighting desired which in turn is a function of the amount of compression and subsequent expansion provided.

Figure 6:
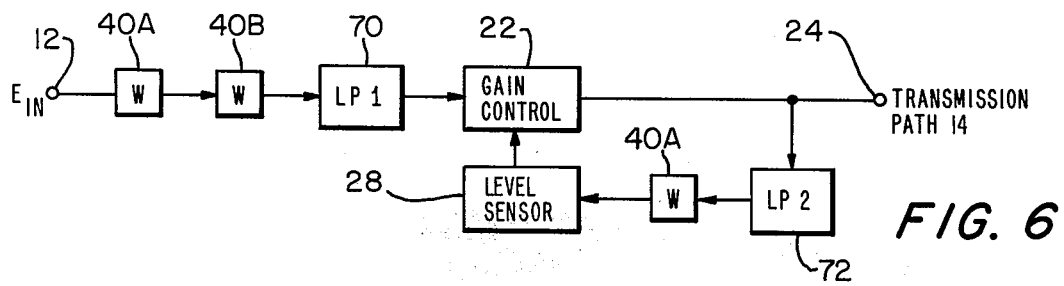
FIG. 6 illustrates a 3:1 compressor incorporating the principles of the present invention.
Figure 7:
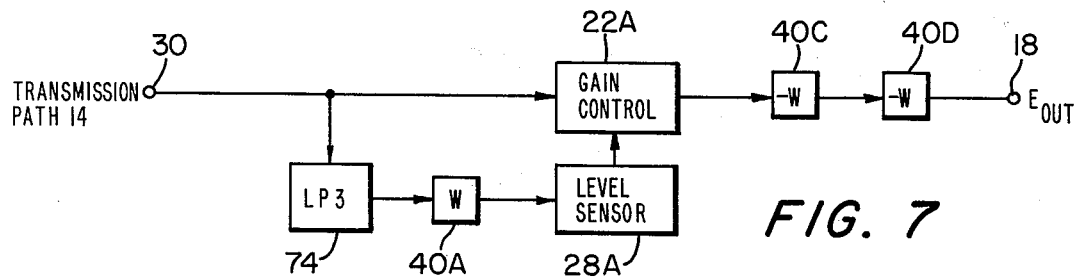
FIG. 7 illustrates a 3:1 expander incorporating the principles of the present invention.

In accordance with the present invention, the networks 40 are substituted for the weighting filters 20, 26, 32 and 34 to provide the desired pre-emphasis and complementary de-emphasis depending on the desired companding ratio. Referring to FIGS. 6 and 7, the weighting networks of the present invention are shown as they are used in a 3:1 compander. The compressor, shown in FIG. 6, includes two networks 40A and 40B providing a double pole-zero network and connected in the signal path. A single pole-zero network 40A is connected in the level sensor path. The input terminal 12 of the compressor is therefore connected to the two cascaded networks in series which in turn are connected to a low pass filter 70. The latter is designed to block signal energy above the frequency bandwidths of interest. The output of low pass filter 70 is connected to the input of the gain control module 22. The output of the gain control module is connected to the compressor output terminal 24 and the input of low pass filter 72. The latter is also designed to block signal energy above the frequency bandwidth of interest. The output of low pass filter 72 is connected to the single pole zero weighting network 40A, which in turn is connected to the input of the level sensor 28. The output of level sensor 28 provides a control signal to the gain control 22. The compressor operates in the same manner as the compressor 10 of FIG. 1 except that by substituting the double pole-zero network and single pole-zero network for the corresponding filters 20 and 26 of the compressor 10 the single frequency sine-wave sweep response of the compressor flattens out over the frequency bandwidth of interest. For FM transmission, the high frequency pre-emphasis provided by the preferred double pole-zero network in the signal path of the compressor will be 24 dB while the high frequency weighting provided by the preferred single pole-zero network in the level sensing path will provide a 12 dB boost so as to provide a substantially flat frequency response throughout the frequency bandwidth of interest.

Such a flat response can be illustrated by the following table in which a single frequency sine-wave sweep through selected frequencies was provided at the input of on a 3:1 compressor of a type described in FIG. 6, with the corresponding variations in output.

TABLE I

| Frequency | db |
|---|---|
| 10 Hz | 0 |
| 25 Hz | 0 |
| 50 Hz | 0 |
| 100 Hz | 0 |
| 200 Hz | 0 |
| 500 Hz | 0 |
| 1 K | 0 |
| 7 K | +.01 |
| 10 K | +.03 |
| 13 K | +.05 |
| 15 K | +.03 |
| 17 K | 0 |
| 20 K | −.27 |
| 30 K | −4.6 |
| 50 K | −26 |
| 100 K | −65 |
| 150 K | −80 |

As will be seen from the table, the response is substantially flat until about 30 KHz where the decibel output begins to drop.

Figure 8:
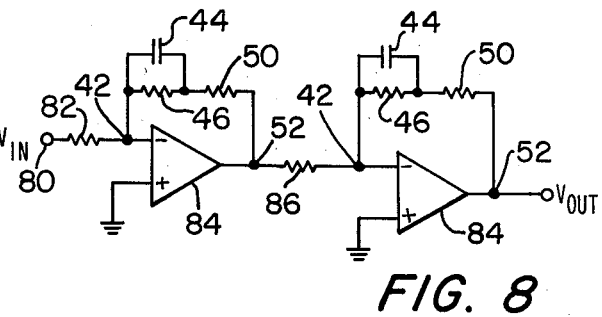
FIG. 8 illustrates a circuit schematic of a preferred embodiment of two cascaded complementary networks, each of the class utilized in the present invention.

In order to decode the output of the improved compressor after transmission or upon playback, the expander, as shown in FIG. 7 is provided which is substantially the complement of the compressor shown in FIG. 6. The expander which is provided with the input terminal 14 is connected to the input of gain control module 22A and also is connected through a feed forward path comprising the low pass filter 74 (designed to block signal energy above the frequency above the bandwidth of interest), the single pole-zero weighting network 40A and the level sensor 28A. The level sensor 28A is set to provide a gain sense of expansion and gain factor depending on the expansion ratio desired. Sensor 28A provides a control signal to the module 22A. The output of module 22A is connected to networks 40C and 40D. Networks 40C and 40D have like pole-zero networks having superimposed poles and zeros and a response curve which is the complement of that provided by networks 40A and 40B. Given the specific design criteria of networks 40A and 40B, the design of networks 40C and 40D can easily be determined to provide the desired complementary response. One network which will provide the complement of networks 40A and 40B is shown in FIG. 8. Network 40C, designed to operate in a voltage mode, comprises an input terminal 80 connected through an input resistor 82 to the negative input terminal of an operational amplifier 84, while the positive input of the latter is connected to system ground. The network 40A forms the feedback path of amplifier 84 with the input 42 connected to the negative input of the amplifier and the current mode output 52 connected to the output of the amplifier which in turn forms the output 86 of the network 40C. In operation, at zero frequency, capacitor 44 acts as an open circuit so that the current provided in the feedback path of operational amplifier 84 is through resistors 46 and 50. At relatively high frequencies where capacitor 44 becomes a short circuit the feedback current increases due to the decrease in the effective resistance provided by the resistor 46.

The network 40D is identical to network 40C so that the number of desired networks can be easily cascaded together to provide the desired arrangement with each network contributing a pole and a zero.

The specific values of resistors 46, 50 and 82 and capacitor 44 of networks 40C and 40D are designed to provide the complementary amplitude-frequency response curve from that shown in FIG. 5.

Each complementary network will therefore have a pole and a zero at the frequencies where networks 40A and 40B have their zero and pole, respectively. In the preferred FM transmission expander, complementary networks 40C and 40D will therefore be designed to provide a pole at 1.2 KHz and a zero at 4 KHz in order to provide the complement of a network having a amplitude-frequency response curve shown in FIG. 5. At these particular pole and zero locations the values of resistors 46 and 50 and capacitor 44 of networks 40C and 40D are at the same values as the corresponding resistors and capacitor of the networks 40A and 40B. As shown in FIG. 7 the network 40D is connected to the output terminal 18. The expander is designed to provide the exact complement of the compressor and therefore a de-emphasis which is the complement of the pre-emphasis provided in the compressor. Thus, in the 3:1 compressor where a pre-emphasis of 24 dB and a 12 dB boost is provided, a complementary de-emphasis of the expander will be a 24 dB de-emphasis with a 12 dB high frequency weighting, provided by the level sensing path.

Although the low pass filters 70, 72 and 74 may be eliminated from the compressor and expander, the filters are preferred since they prevent problems due to both input noise which is above the high frequency cutoff of the transmission system and may cause an error in tracking at low levels and problems due to transmission path noise in path 14 which lies outside the spectrum of the input signal at terminal 30 which will cause tracking errors in the expander. It will be noted that low pass filters 72 and 74 are identical where exact transient tracking is required. Sine-wave sweep response will be flat if low pass filters 72 and 74 are identical or if three times the response difference between filter 72 and 74 is present in filter 70 with due regard for the polarity difference. Hence, with careful control of the high frequency roll off and ripple of the three filters 70, 72 and 74, exact flat sine wave response can be achieved with both a stable gain control feedback loop and adequate control of the effects of noise outside the system's desired bandwidth.

It will be noted that the use of the networks is not limited to a 3:1 compander. For example, in a 2:1 system of this class, a single weighting network 40A shown in FIG. 3 is placed in the signal path of the compressor at its input, a single complementary weighting network 40C, shown in FIG. 8 in the signal path at the expander output and a single weighting network 40A is placed in the level sensing path of both the compressor and expander. Similarly, a 4:1 system requires three cascaded weighting networks at each of the compressor input, three complementary networks at the expander output and a single network in the level sensing path of both the compressor and expander. Other pre-emphasis and de-emphasis and weighting can be achieved as illustrated by the following table in which the number of networks for each of the level sensing and signal paths are indicated in order to provide the desired pre-emphasis and de-emphasis. In all cases the number of networks indicated for the level sensing path and signal path will be the same for the compressor and expander, with the networks in the signal path of the compressor being the complement of those used in the signal path of the expander.

TABLE II

| Compander Ratio | Networks in Level Sensing Path | Networks in Signal Path |
|---|---|---|
| 1.4:1 | 5 | 2 |
| 1.5:1 | 2 | 1 |
| 1.6:1 | 5 | 3 |
| 2:1 | 1 | 1 |
| 3:1 | 1 | 2 |
| 4:1 | 1 | 3 |
| 5:1 | 1 | 4 |

In determining how many networks are necessary to provide the required weighting for a particular compander ratio, one expresses the ratio in terms of the lowest whole numbers (thus 1.4:1 becomes 7:5) to provide a ratio $m:n$. The number $m$ to the left of the colon indicates the total number of networks for each compressor and expander, while the number to the right, $n$, indicates the number to be provided in the level sensing path of each. Thus, in a 1.4:1 compander, ($m$) five networks are utilized in the level sensing path of each the compressor and expander leaving ($n-m$) two for each of the signal paths.

It will be appreciated therefore that the present invention provides greater dynamic range across the entire frequency bandwidth of interest as well as greater high frequency pre-emphasis than that which was heretofore obtainable. Experiments have indicated that a 57 dB unweighted FM signal-to-noise ratio is sufficient to make the effects of differentiated white noise inaudible and the presence of test tones at 100 dB SPL listening level through Young and Wenner's work (described in "Masking of White Noise by Pure Tone, Frequency-Modulated Tone, and Narrow-Band Noise", the *Journal of the Acoustic Soc. of America,* Vol. 41, No. 3 (1967), pp. 700–705), indicates that the perceptible noise threshold is 80 dB below a test tone at the low frequency end of the spectrum. The present invention requires less than a 40 dB signal to noise ratio to transmit high quality program material with negligible degradation of perceived sound quality.

Although the present invention has been described as useful in compressor with a negative feedback level sensing path and an expander with a positive feedforward level sensing path, the teachings can also be applied to compressors with negative feedforward level sensing paths and expanders with positive feedback level sensing paths.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. In a device for use in a companding system, said device comprising an output terminal; an input terminal for receiving an electrical input signal having a predetermined frequency bandwidth; a signal path connecting said input terminal with said output terminal and including amplification means for amplifying said input signal by a gain variable responsively to a control signal so as to provide a signal output dynamically compressed with respect to said input signal when the sense of said gain is set so that said device encodes said input signal, and dynamically expanded with respect to said input signal when the sense of said gain is set so that said device decodes said input signal; a level sensing path connecting said amplification means to a point in said signal path; means in said signal path for sensing the amplitudes of signals transmitted through said signal path at said point and for providing, responsively to said sensing, said control signal as a logarithmic function of the amplitude of the signals sensed by said means for sensing, the improvement comprising:

means, including at least one network having an amplitude frequency response curve with a pole or zero at each of one or more predetermined frequency locations and disposed in said signal path and at least one other network having an amplitude-frequency response curve with a pole or zero at each of said one or more predetermined frequency locations and disposed in said level sensing path, for emphasizing and weighting within a portion of said frequency bandwidth the energy content of signals transmitted through said signal path, with respect to the energy content of said signals in the remaining portions of said frequency bandwidth so that the response of said device at said output terminal to a single frequency sine wave sweep throughout said frequency bandwidth applied to said input terminal is substantially flat throughout said frequency bandwidth.

2. In a device according to claim 1 wherein the sense of said gain is set so that said device encodes said input signal and said one network in said signal path and said one other network in said level sensing path are designed to have superimposed poles and zeros.

3. In a device according to claim 1 wherein said device provides a predetermined compression ratio, $n:m$, where $n$ and $m$ are whole integers, and said signal path includes $n-m$ of said one networks and said level sensing path includes $m$ of said one other networks.

4. In a device according to claim 3 wherein all of said networks in said signal path and said level sensing path have superimposed poles and zeros.

5. In a device according to claim 1 wherein the sense of said gain is set so that said device decodes said input signal and said one network and said one other network are both single pole-zero networks, and said one network is designed to have its zero and pole at the same frequencies as the respective pole and zero of said one other network.

6. In a device according to claim 1 wherein said device provides a predetermined expansion ratio, $n:m$, where $n$ and $m$ are whole integers, and said signal path includes $n-m$ of said one networks and said level sensing path includes $m$ of said one other networks.

7. In a device according to claim 6 wherein said networks in said signal path have superimposed poles and zeros when $n-m \geq 2$ and said networks in said level path have superimposed poles and zeros when $m \geq 2$.

8. In a device according to claim 7 wherein said networks in said signal path are designed to have their superimposed zeros and poles at the same frequencies as the respective poles and zeros of said networks in said level sensing path.

9. In a device in accordance with claim 1 wherein said signal path and said level sensing path each include filters for blocking energy outside of said predetermined frequency bandwidth.

10. In a system for conditioning an input signal having a predetermined frequency bandwidth, said system comprising an input terminal for receiving said input signal, an output terminal, a signal path coupled between said input and output terminals and including amplification means for amplifying said input signal by a gain variable responsively to a control signal so as to provide an output signal dynamically modified with respect to said input signal, and a level sensing path including means for sensing the amplitude of said output signal and for providing, responsively to said sensing, said control signal as a logarithmic function of the amplitude of said output signal, the imporvement comprising:

means, including at least one network disposed in said signal path and at least one other network disposed in said level sensing path, for emphasizing and weighting within a portion of said frequency bandwidth the energy content of said input signal with respect to the energy content of said input signal in the remaining portions of said frequency bandwidth so that the response of said system at said output terminal to a single-frequency sine wave sweep throughout said frequency bandwidth applied to said input terminal is substantially flat throughout said frequency bandwidth.

11. In a system according to claim 10 wherein each of said networks is a single pole-zero network.

12. In a system according to claim 11, wherein said networks have superimposed poles and zeros.

13. In a system according to claim 11 wherein said output signal of said amplification means is dynamically compressed with respect to said input signal by a ratio $n:m$, where $n$ and $m$ are whole numbers, and said signal path includes $n-m$ of said one networks and said level sensing path includes $m$ of said one other networks, all of said networks having superimposed poles and zeros.

14. In a system according to claim 12 wherein said predetermined frequency bandwidth is the audio range, and said means for emphasizing and weighting within a portion of said frequency bandwidth pre-emphasizes and weights the high frequency energy content of said input signal with respect to the low energy content of said input signal.

15. In a system according to claim 14 wherein the zero of each of said networks is approximately located at 1.2 KHz and the pole is approximately located at 4.0 KHz.

16. In a system for conditioning an input signal having a predetermined frequency bandwidth, said system comprising an input terminal for receiving said input signal, an output terminal, a signal path coupled between said input and output terminals and including amplification means for amplifying said input signal by a gain variable responsively to a control signal, and a level sensing path including means for sensing the amplitude of said input signal and for providing, responsively to said sensing, said control signal as a logarithmic function of the amplitude of said input signal, the improvement comprising:

means, including at least one network disposed in said signal path and at least one other network disposed in said level sensing path, for emphasizing and weighting within a portion of said frequency bandwidth the energy content of said input signal, with respect to the energy content of said input signal in the remaining portions of said frequency bandwidth so that the response of said system at said output terminal to a single-frequency sine wave sweep throughout said frequency bandwidth applied to said input terminal is substantially flat throughout said frequency bandwidth.

17. In a system according to claim 16 wherein each of said networks is a single pole-zero network.

18. In a system according to claim 17 wherein said one network in said signal path is designed to have its zero and pole at the same frequencies as the respective pole and zero of said one other network in said level sensing path.

19. In a system according to claim 17 wherein said amplification means provides an output signal in response to said input signal which is dynamically expanded with respect to said input signal by a ratio $n:m$, where $n$ and $m$ are whole integers, and said signal path includes $n-m$ of said one networks and said level sensing path includes $m$ of said one other networks.

20. In a system according to claim 19 wherein said predetermined frequency bandwidth is the audio range and said means for emphasizing and weighting de-emphasizes and weights the high frequency energy content of said input signal with respect to the low energy content of said input signal.

21. In a system according to claim 20 wherein the pole of each of said one networks in said signal path and the zero of each of said one other networks in said level sensing path are both located approximately at 1.2 KHz and the zero of each of said one networks and the pole of each of said one other networks is located at 4.0 KHz.

* * * * *